(12) United States Patent
Chalfant et al.

(10) Patent No.: US 8,502,541 B2
(45) Date of Patent: Aug. 6, 2013

(54) BATTERY TESTING DYNAMIC DELTA VOLTAGE MEASUREMENT

(75) Inventors: Robert W. Chalfant, Farmington, NY (US); Jason A. Lupienski, Pittsford, NY (US); John D. Tompkins, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 425 days.

(21) Appl. No.: 12/916,754

(22) Filed: Nov. 1, 2010

(65) Prior Publication Data
US 2012/0105071 A1 May 3, 2012

(51) Int. Cl.
*G01N 27/416* (2006.01)
*H02J 7/04* (2006.01)
*H02J 7/16* (2006.01)

(52) U.S. Cl.
USPC ........... 324/433; 324/429; 320/148; 320/151; 320/156; 320/161

(58) Field of Classification Search
CPC .................................................. G01R 19/16542
USPC .................................................. 324/429, 433
See application file for complete search history.

(56) References Cited

U.S. PATENT DOCUMENTS

| | | | | | |
|---|---|---|---|---|---|
| 4,665,370 | A | * | 5/1987 | Holland | 324/429 |
| 5,159,272 | A | * | 10/1992 | Rao et al. | 324/429 |
| 2006/0255764 | A1 | * | 11/2006 | Cho | 320/116 |
| 2008/0053716 | A1 | * | 3/2008 | Scheucher | 180/2.1 |
| 2010/0156351 | A1 | * | 6/2010 | Ugaji et al. | 320/132 |
| 2010/0295549 | A1 | * | 11/2010 | Bertness | 324/426 |

* cited by examiner

*Primary Examiner* — Drew A Dunn
*Assistant Examiner* — Nathaniel Pelton
(74) *Attorney, Agent, or Firm* — Dinsmore & Shohl LLP

(57) ABSTRACT

A method of evaluating battery packs is described. The method includes measuring a cell open voltage for each battery cell group in a section of battery cells; measuring a voltage under charge, or a voltage under load, or both, at a predetermined time interval for each battery cell group in the section of battery cells; determining the magnitude of the difference between the open cell voltage and the voltage under charge, or the voltage under load, or both, for each battery cell group in the section of battery cells by subtracting the voltage under charge from the cell open voltage, or subtracting the voltage under load from the cell open voltage, or both; and determining if the magnitude of the difference between the open cell voltage and the voltage under charge, or the voltage under load, or both, for each battery cell group in the section of battery cells exceeds a predetermined level.

9 Claims, 8 Drawing Sheets

БATTERY TESTING DYNAMIC DELTA
VOLTAGE MEASUREMENT

BACKGROUND OF THE INVENTION

This invention relates generally to battery packs and more particularly to testing methods for determining the condition of a battery cell or weld.

The battery assembly for hybrid or plug-in electric vehicles (EV) may consist of a plurality of battery cells which are stacked and joined together to form a module or pack. The battery for a long driving range EV may contain more than 200 battery cells. Typically, after stacking and assembling the battery components into a module, every two or three adjacent battery cells are welded together to form parallel electric connections. Each cell has at least two tabs or electric terminals (one positive, one negative) for such welding. An interconnect board can be added and welded to the cells to complete the serial connection of the battery pack, if desired. The welding operations require proper welding machines and tooling, and they are expensive and time consuming operations. Improper welding can lead to problems with the battery pack in use.

Methods of testing weld and cell integrity have been developed. For example, the individual cell voltage has been measured, as well as the voltage range across a module, section, or pack at a particular time during a battery discharge cycle. However, these methods have not conclusively identified problems with external welds or cells. For example, a cell can be out of balance in a pack, but still be a quality part. Simple balancing techniques can be used to resolve these issues. However, if the imbalance is due to a weld problem, then the module would have to be scrapped.

In addition, a problem can occur when cells charge and discharge at different rates under different dynamic conditions. Increased temperature or significant temperature rises in the pack can be caused by improper charging or discharging, leading to lost capacity and damage to the cell. This is often an impedance issue either within the cell or in an external weld to the interconnect board (ICB).

SUMMARY OF THE INVENTION

One aspect of the invention is a method of evaluating battery packs. One embodiment of the method includes measuring a cell open voltage for each battery cell group in a section of battery cells; measuring a voltage under charge, or a voltage under load, or both, at a predetermined time interval for each battery cell group in the section of battery cells; determining the magnitude of the difference between the open cell voltage and the voltage under charge, or the voltage under load, or both, for each battery cell group in the section of battery cells by subtracting the voltage under charge from the cell open voltage, or subtracting the voltage under load from the cell open voltage, or both; and determining if the magnitude of the difference between the open cell voltage and the voltage under charge, or the voltage under load, or both, for each battery cell group in the section of battery cells exceeds a predetermined level.

DETAILED DESCRIPTION OF THE INVENTION

Figure 1:
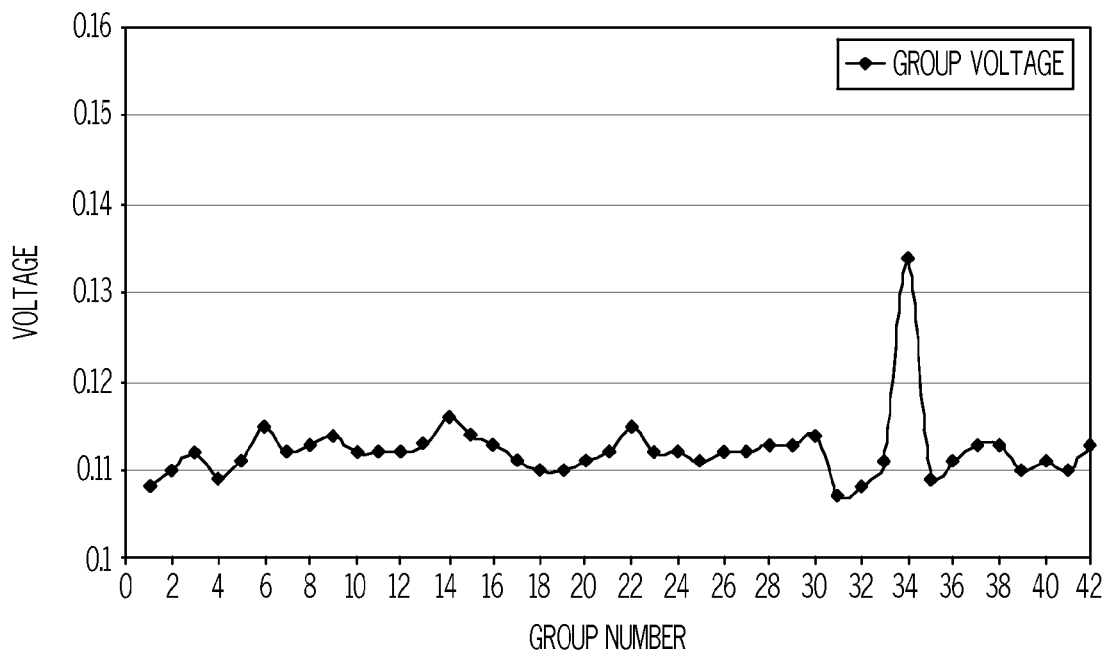
FIG. 1 is a graph illustrating a weld failure under charge according to one embodiment of the present invention.

The present method can be used to detect a variety of battery problems including weld failures, internal battery cell failures, and lot to lot variations in battery cells. The test can be used as a manufacturing process control parameter. The test is fast, which helps to reduce manufacturing test cycle time. It can identify potential weld durability issues during manufacturing, where they can be corrected before the product is released to the customer which will reduce pack failures in use.

The method detects both cell and weld quality quickly. It involves measuring all of the cell voltages at rest (OCV) and comparing that to the voltages measured at a specific time under load or charge. The dynamic delta voltage is calculated for every cell group within a pack/section. The range of all of the individual voltage dynamic delta voltages can directly show issues with a cell group or an external weld to interconnect board. This value can be used for both a product specification and as a manufacturing process testing parameter. It has also been used to evaluate battery cell lot to lot variation within a battery pack/cell.

The measurement evaluates the change from rest to dynamic conditions. Previous measurement methods only looked at static voltage range or range under load which did not indicate certain failure modes.

A weld failure found by testing is typically a cell that is cut (perforated), or not attached properly to the interconnect board so that it can conduct sufficient current through an electrical joint, e.g., 315-340 A.

A pack capacity failure arises when the batteries during the charge and discharge cycles recommended by the battery cell manufacturer do not meet their rated capacity. Capacity failure can be due to welding problems or cell problems, such as high internal resistance.

Mixed cell failure involves the use of cells manufactured at different times in the same pack.

The level of acceptable/unacceptable variation of DDV range for each type of failure can be selected by the user. The level can vary depending on the needs of the particular application and battery cell. For example, a level of 30 mV of variation of DDV range could be selected for weld failure. Therefore, if one cell measured 230 mV of DDV at a time while the others measured 130 mV of DDV, the variation would be 100 mV, and a weld failure would be indicated.

The level for capacity failure will depend on the specification of the manufacturer for the cells being used. For example, a pack capacity failure would occur when a battery cell is rated for 45 Ah, but it only has a capacity of 43 Ah initially (beginning of life).

The level for mixed cell failure could be set at 30 days, e.g., all cells in a group or pack would be manufactured within 30 days of one another. Mixed cell failure would exist if cells manufactured on May 1, 2010 were mixed with cells manufactured on May 1, 2009.

Using the present invention, suspect welds and cell issues show up in as little as about 2 to 3 sec at initial charge and discharge, as opposed to other methods which take longer cycle times and evaluate temperature and voltages at only static time intervals.

The dynamic delta voltage measurement and calculation can be done under either charge conditions or load conditions or both as shown below.

Dynamic Delta Voltage Measure Calculation Under Charge Condition $$ddV = |(GV_{Rest} - GV_{UC})|$$

$$DDV_{Max} = \text{Max}(ddv_1, ddv_2, \ldots ddv_N)$$

$$DDV_{Min} = \text{Min}(ddv_1, ddv_2, \ldots ddv_N)$$

$$DDVR_{Range} = DDV_{Max} - DDV_{Min}$$

Dynamic Delta Voltage Measure Calculation Under Load Condition $$ddV = |(GV_{Rest} - GV_{UL})|$$

$$DDV_{Max} = \text{Max}(ddv_1, ddv_2, \ldots ddv_N)$$

$$DDV_{Min} = \text{Min}(ddv_1, ddv_2, \ldots ddv_N)$$

$$DDV_{Range} = DDV_{Max} - DDV_{Min}$$

where:
$GV_{Rest}$=Group Voltage at Rest
$GV_{UC}$=Group Voltage Under Charge at T time interval
$GV_{UL}$=Group Voltage Under Load at T time interval
$DDV_{GV}$=Group Voltages Dynamic Delta Voltage
$DDV_{Max}$=Maximum Group Voltage DDV within a battery pack or section
$DDV_{Min}$=Minimum Group Voltage DDV within a battery pack or section
$SDDV_{Range}$=Section Dynamic Delta Voltage Range
$PDDV_{Range}$=Pack Dynamic Delta Voltage Range
N=Number of Battery Cell Groups within a pack or section There are typically three cells in a group. The cells in a group are welded to an interconnect board. The number of groups in a section can vary. For example, a section with 126 cells would have 42 groups, while a 90 cell section would have 30 groups, and a 72 cell section would have 24 groups. One or more sections can be used to make up a pack. The number of cells needed will depend on the type of application for which the pack is being used.

Figure 2:
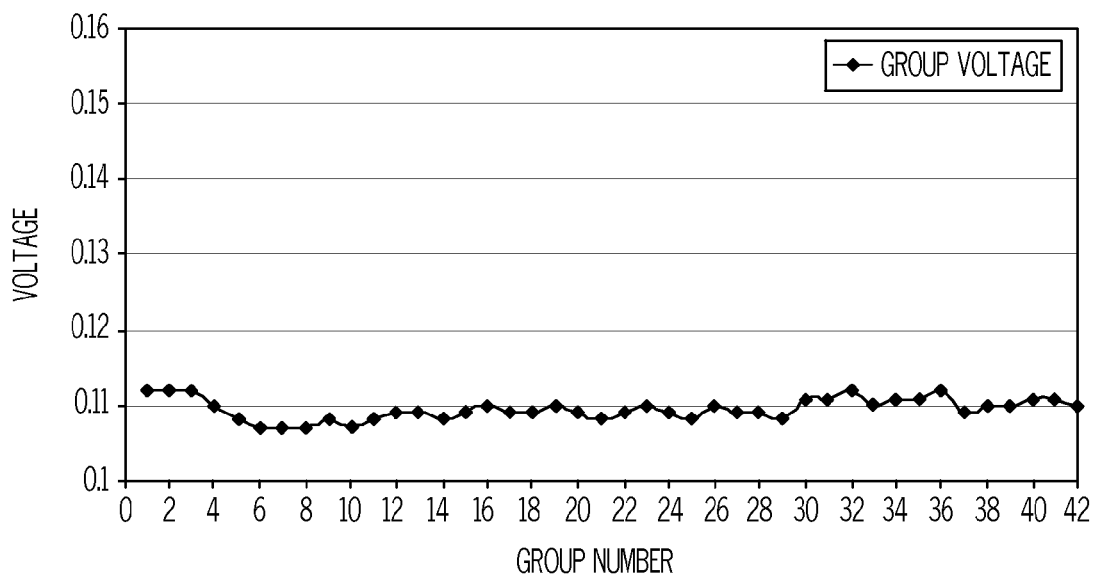
FIG. 2 is a graph illustrating no weld failures under charge according to one embodiment of the present invention

FIG. 1 shows the measured voltage under a 90 A charge at a 2 sec charge interval for the cell groups in a section. The $DDV_{Range}$ for this particular section was approx. 27 mV (135 mV-108 mV). With an allowed variation of 20 mV, this indicates a weld failure of Group 34. FIG. 2 shows a passing section, in which the $DDV_{Range}$ is 5 mV.

Figure 3:
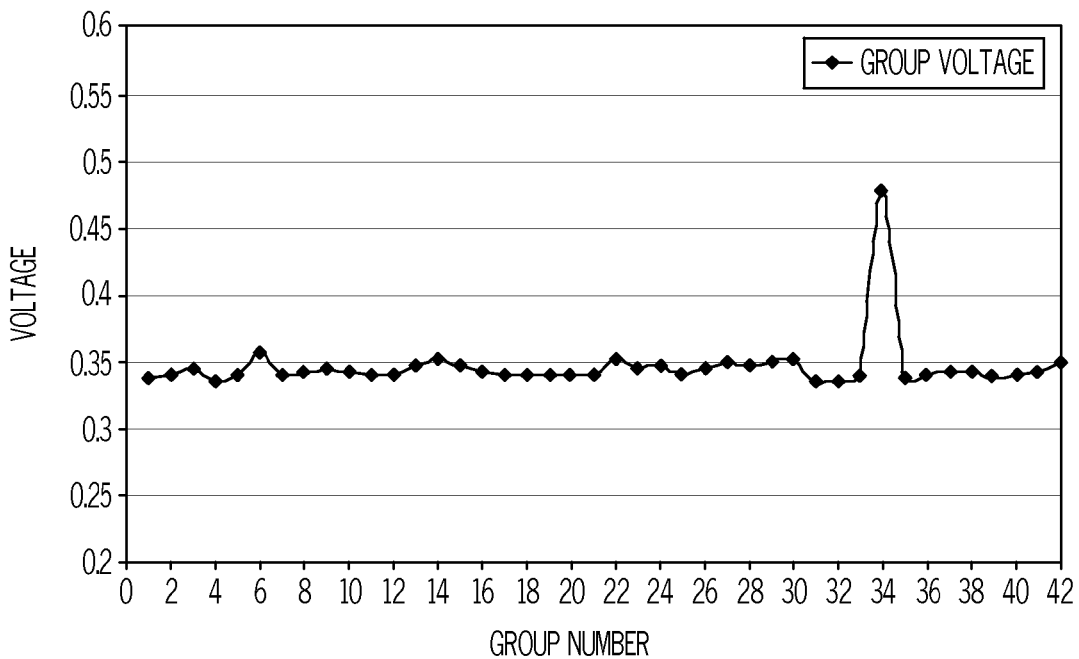
FIG. 3 is a graph illustrating a weld failure under discharge according to one embodiment of the present invention.
Figure 4:
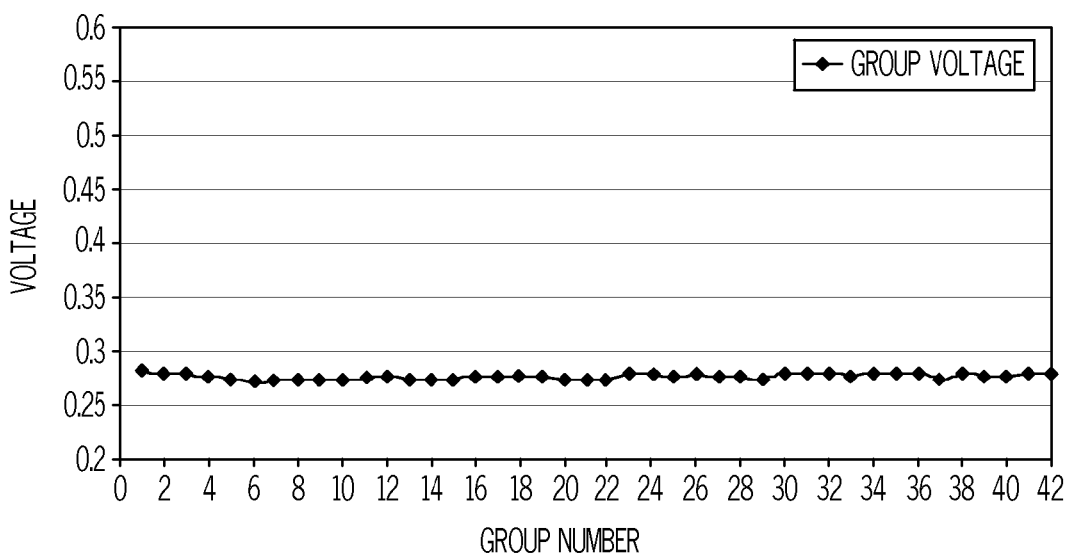
FIG. 4 is a graph illustrating no weld failure under discharge according to one embodiment of the present invention

FIGS. 3-4 show the measured voltage during discharge at 320 A for the same sections shown in FIG. 1-2. FIG. 3 shows the failure with a particular $DDV_{Range}$ of 141 mV, while FIG. 4 shows the passing section with a $DDV_{Range}$ of 6 mV.

FIGS. 1-4 show that either voltage under charge or voltage under discharge or both can be used for the failure analysis.

Figure 5:
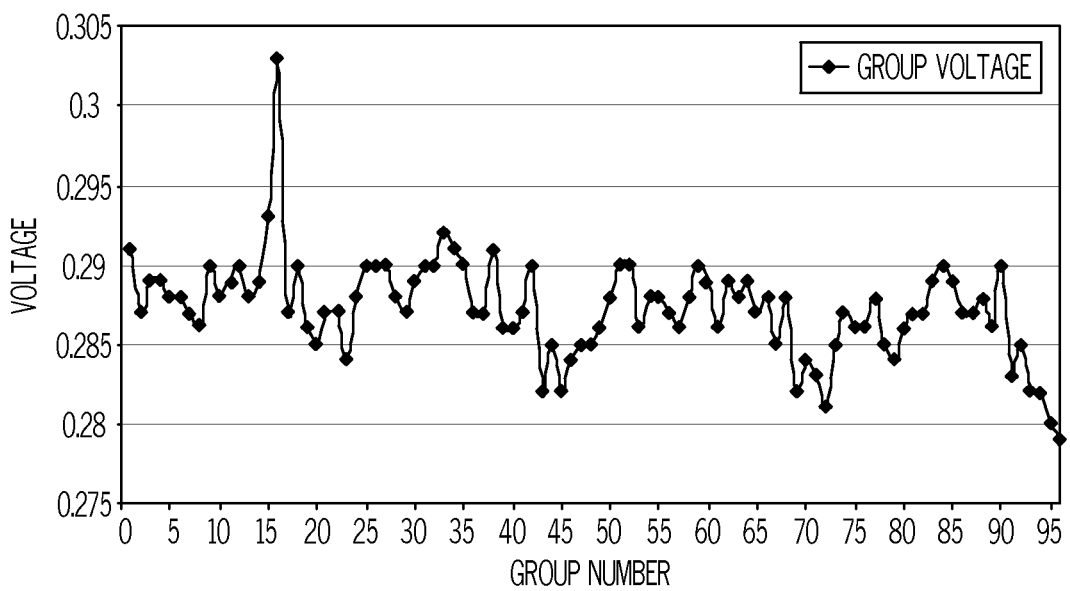
FIG. 5 is a graph illustrating a pack capacity failure under discharge according to one embodiment of the present invention.
Figure 6:
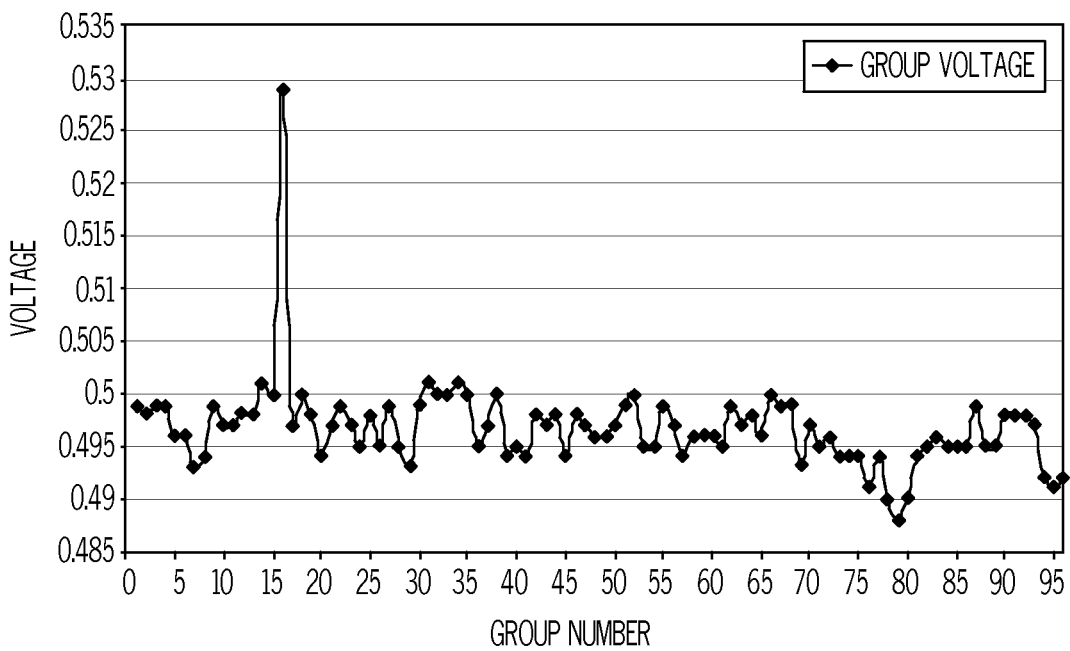
FIG. 6 is a graph illustrating a pack capacity failure under discharge according to one embodiment of the present invention.
Figure 7:
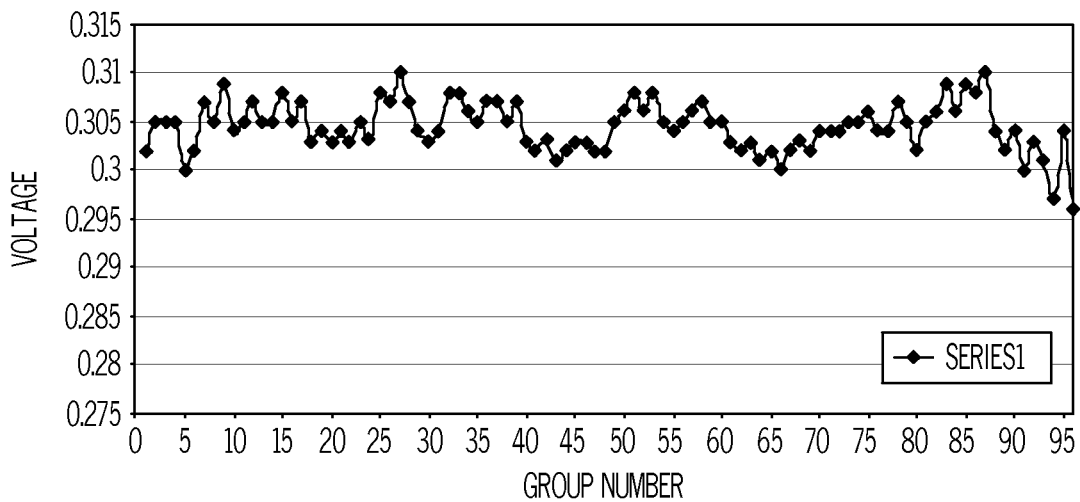
FIG. 7 is a graph illustrating pack capacity passing under charge according to one embodiment of the present invention.

FIGS. 5-6 show capacity failure for a pack during discharge at 340 A at a 2 sec interval and a 30 sec interval, respectively. The pack failed the capacity test with a 42 Ah compared to the rated capacity of 45 Ah, and a range of 24 mV. The range for the pack at 30 sec was 41 mV. FIG. 7 shows a passing capacity for a pack with 44.5 Ah, and a range of 14 mV. FIGS. 5-6 show that the failure can be determined accurately at 2 sec.

Figure 8:
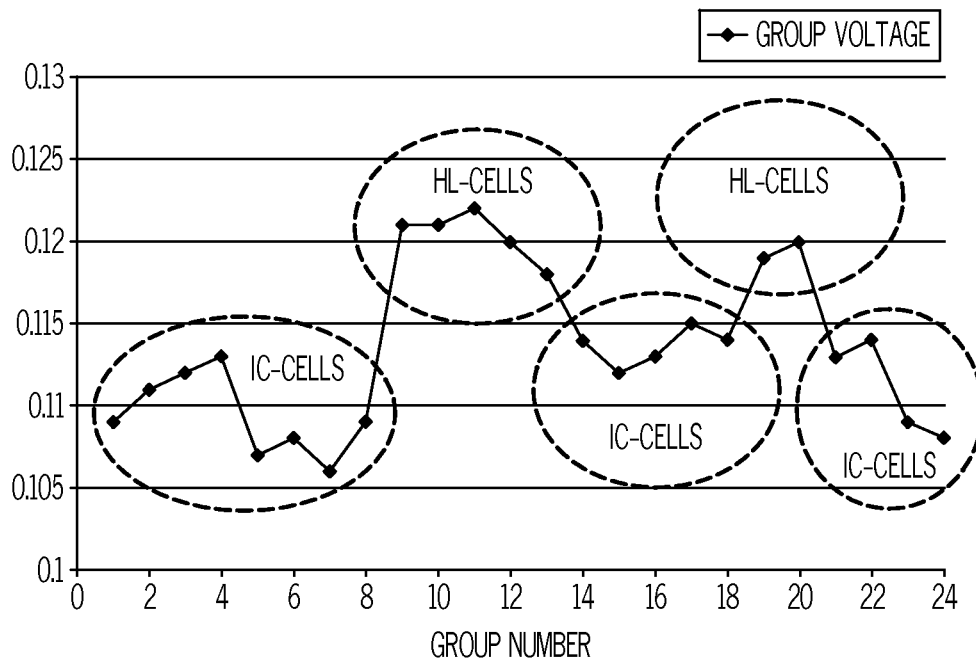
FIG. 8 is a graph illustrating mixed cell failure under charge according to one embodiment of the present invention.
Figure 9:
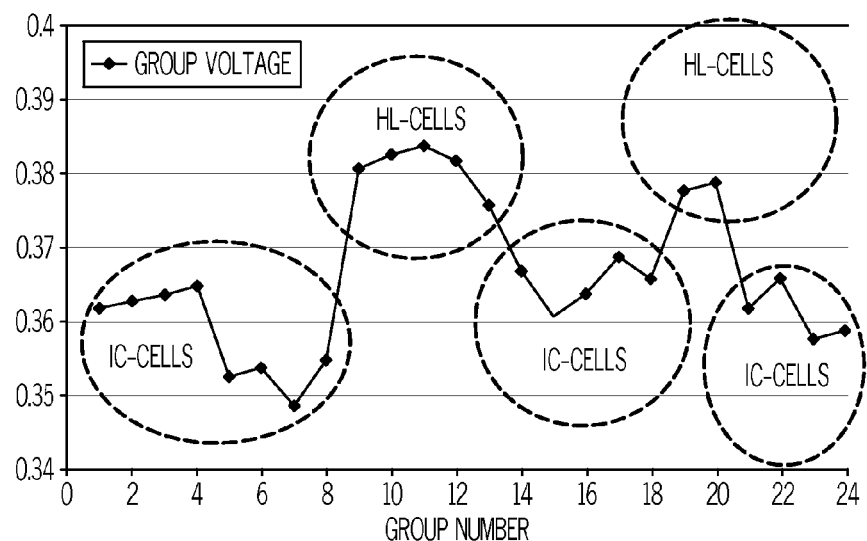
FIG. 9 is a graph illustrating mixed cell failure under discharge according to one embodiment of the present invention.
Figure 10:
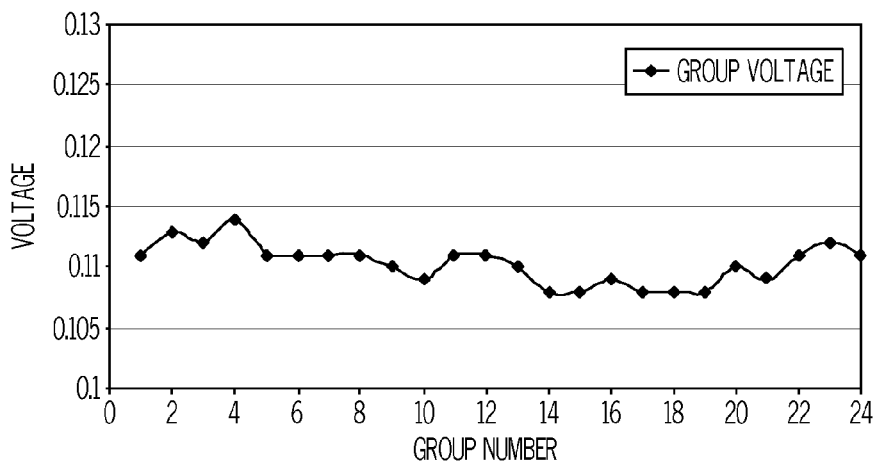
FIG. 10 is a graph illustrating mixed cell passing under charge according to one embodiment of the present invention.
Figure 11:
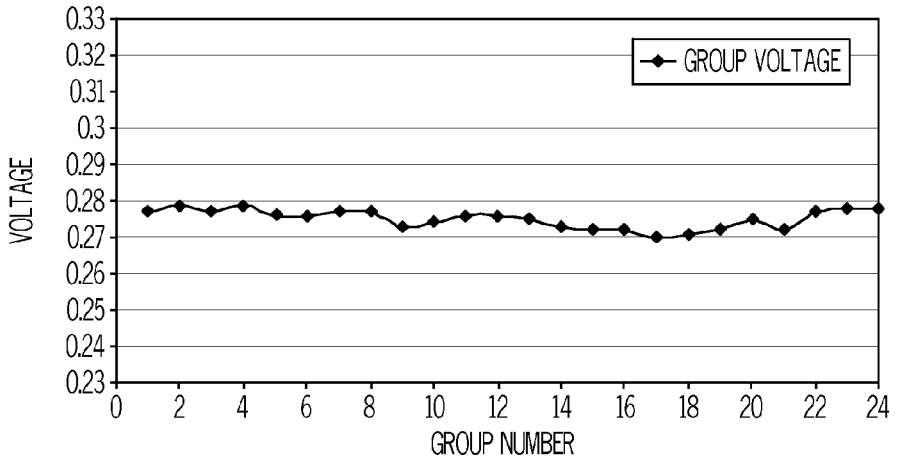
FIG. 11 is a graph illustrating mixed cell passing under discharge according to one embodiment of the present invention.

FIGS. 8-9 show mixed cell failure at 2 sec under a charge (90 A) condition with a 18 mV range and a discharge (400 A) condition with a 36 mV range (HL Cells were manufactured in December of 2008, and IC Cells were manufactured in March 2009). FIGS. 10-11 shows a non mixed cell passing section for a charge (90 A) condition with a 6 mV range and a discharge (320 A) condition with a 9 mV range.

Figure 12:
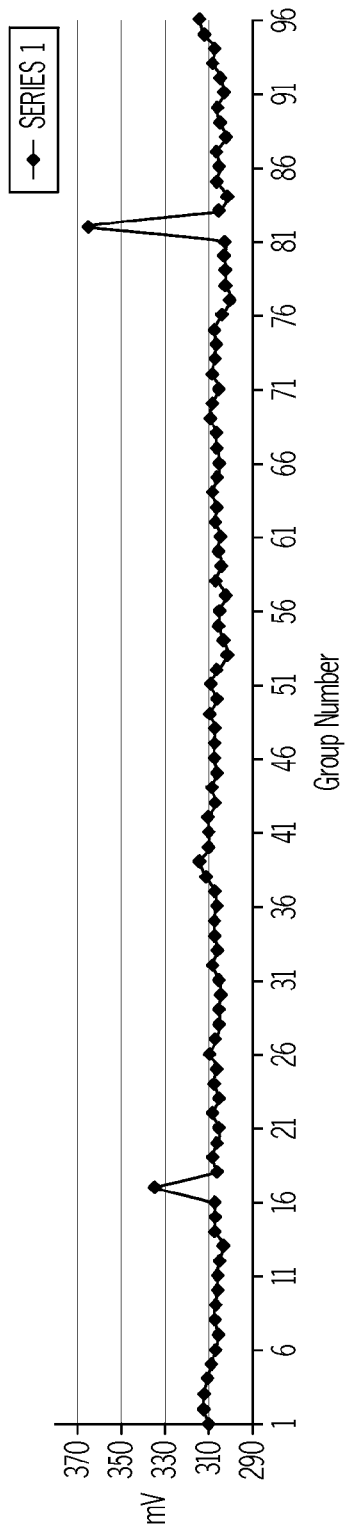
FIG. 12 is a graph illustrating a weld failure under discharge.
Figure 13:
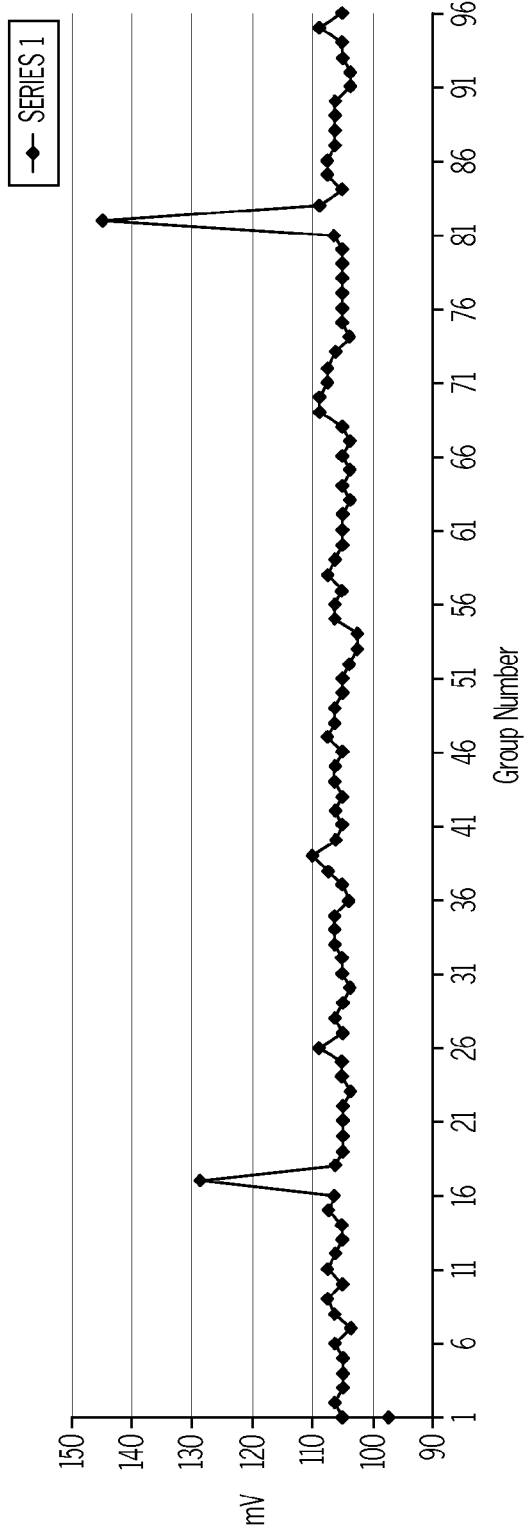
FIG. 13 is a graph illustrating a weld failure under discharge.

FIGS. 12-13 show the $DDV_{Range}$ for a pack that passed a 340 amp discharge pulse where the cell distribution was monitored, and a HPPC (hybrid power pulse characterization) test which is a 10 second 220 amp charge/discharge at 70% SOC (state of charge). However, the $DDV_{Range}$ testing showed a problem with the weld at groups 17 (32 mV difference) and 82 (65 mV difference).

Figure 14:
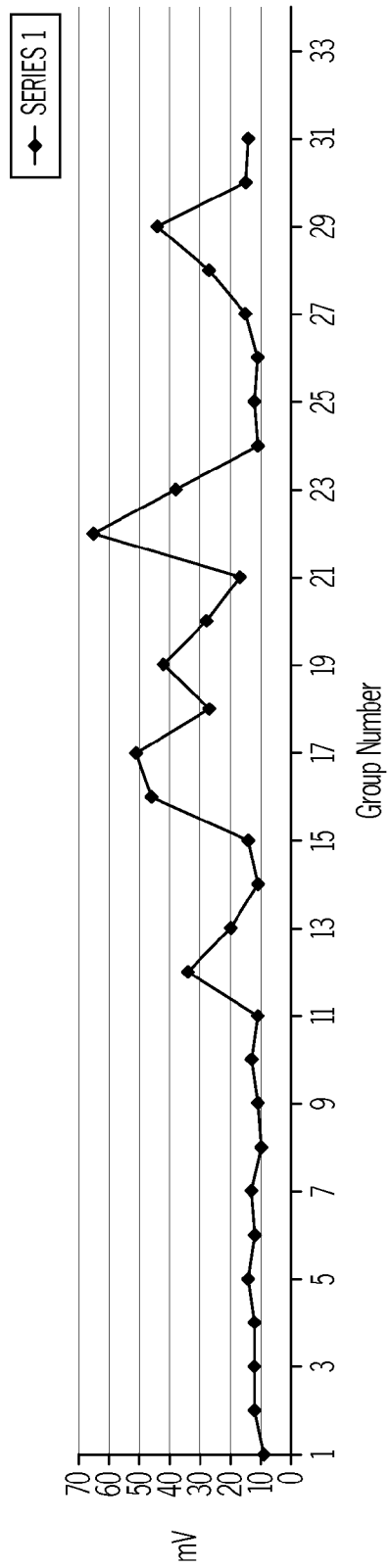
FIG. 14 is a graph illustrating a weld failure under discharge.
Figure 15:
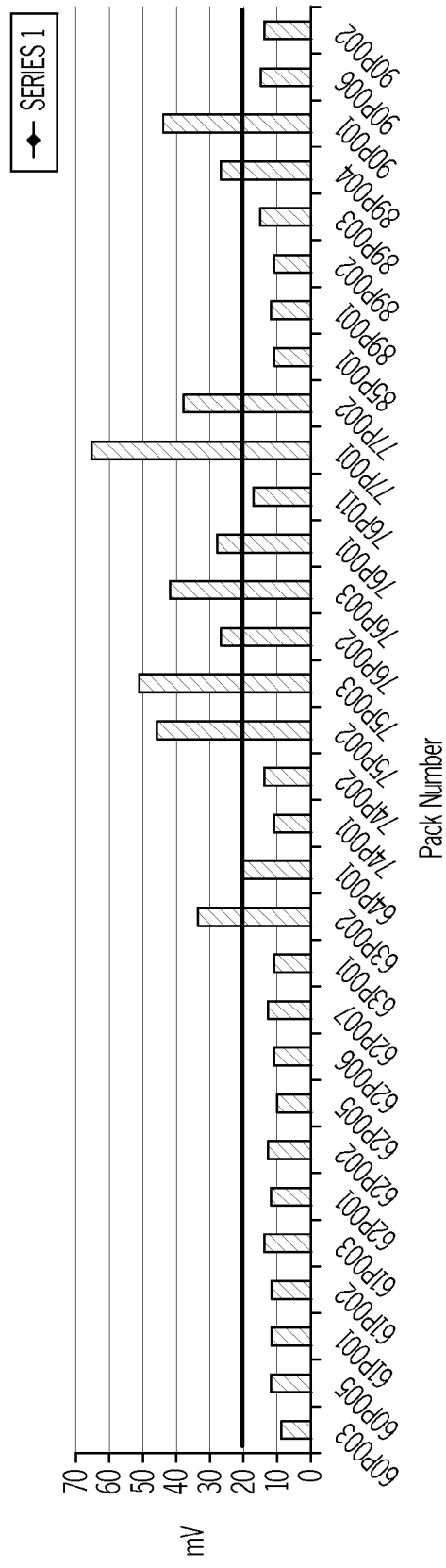
FIG. 15 is a bar graph of multiple packs with weld failure under discharge of FIG. 14.

FIG. 14 shows a pack with multiple perforated external welds. FIG. 15 show multiple packs from the battery pack manufacturing system that showed a $DDV_{Range}$ issue with 10 packs. The welds from these packs were visually inspected and found to be perforated on the tabs.

If the testing reveals a problem with the battery pack, it can be repaired. For example, if a weld failure is indicated, the group can be rewelded. The repaired section can then be retested to determine whether it meets the requirements. If necessary, the section containing the failure can be replaced and retested.

Figure 16:
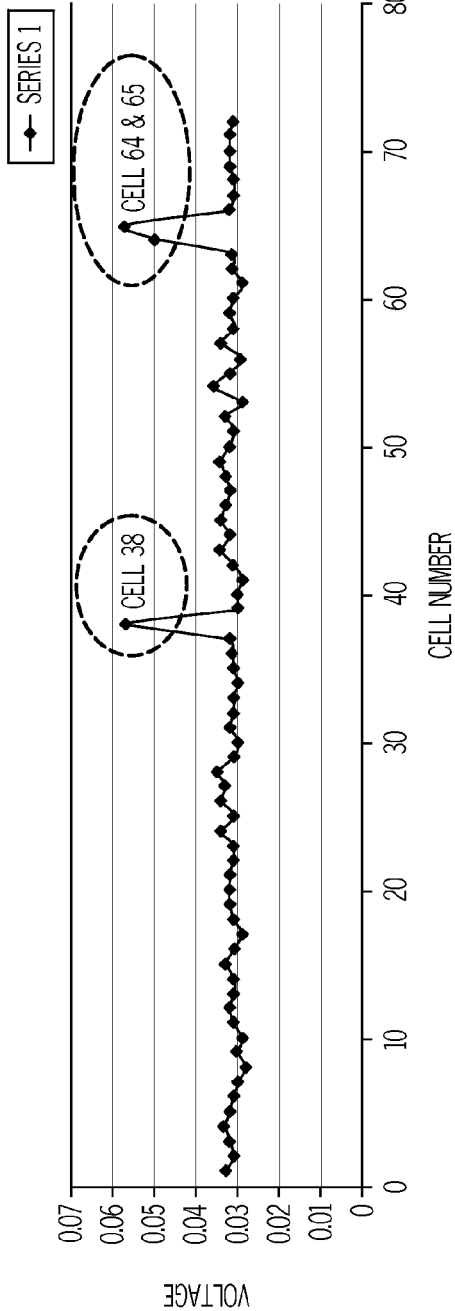
FIG. 16 is a graph illustrating a weld failure under charge.
Figure 17:
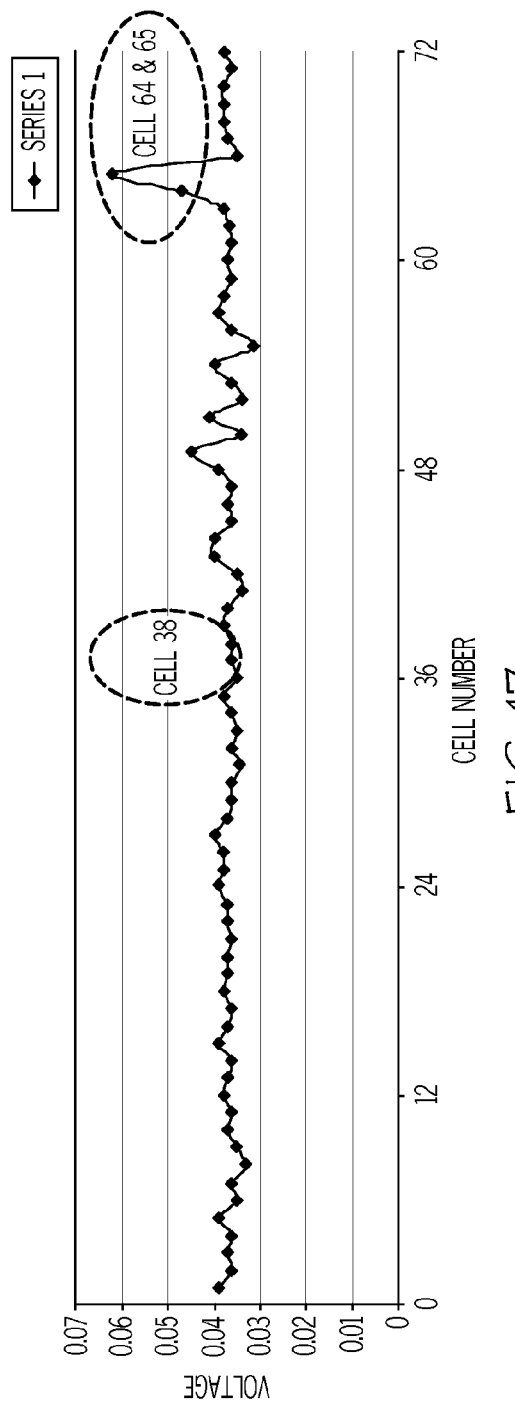
FIG. 17 is a graph illustrating the repair of the weld failure in FIG. 16.

FIG. 16 shows the weld failure of groups 38, 64, and 65. The groups were rewelded and the test was rerun. Group 38 was repaired, but groups 64 and 65 were not. They would have to be replaced (or the section containing them would have to be replaced).

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the term "device" is utilized herein to represent a combination of components and individual components, regardless of whether the components are combined with other components. For example, a "device" according to the present invention may comprise an electrochemical conversion assembly or fuel cell, a vehicle incorporating an electrochemical conversion assembly according to the present invention, etc.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A method of evaluating battery packs comprising:
    measuring a cell open voltage for each battery cell group in a section of battery cells;
    measuring a voltage under charge, or a voltage under load, or both, at a predetermined time interval for each battery cell group in the section of battery cells;
    determining a magnitude of the difference between the open cell voltage and the voltage under charge, or the voltage under load, or both, for each battery cell group in the section of battery cells by subtracting the voltage under charge from the cell open voltage, or
    subtracting the voltage under load from the cell open voltage, or both; and
    determining a maximum difference between the open cell voltage and the voltage under charge, or the voltage under load, or both;
    determining a minimum difference between the open cell voltage and the voltage under charge, or the voltage under load, or both;
    determining a range by subtracting the minimum difference from the maximum difference; and
    determining if the range exceeds a predetermined level.

2. The method of claim 1 wherein the predetermined time interval is less than about 20 sec.

3. The method of claim 1 wherein the predetermined time interval is less than about 10 sec.

4. The method of claim 1 wherein the predetermined time interval is less than about 5 sec.

5. The method of claim 1 wherein if the range exceeds the predetermined level, repairing the group.

6. The method of claim 5 wherein repairing the group comprises rewelding the group.

7. The method of claim 6 further comprising retesting the repaired group.

8. The method of claim 5 wherein repairing the group comprises replacing a module containing the group.

9. The method of claim 8 further comprising retesting the repaired group.

* * * * *